United States Patent [19]
Gerpheide et al.

[11] Patent Number: 5,565,658
[45] Date of Patent: Oct. 15, 1996

[54] CAPACITANCE-BASED PROXIMITY WITH INTERFERENCE REJECTION APPARATUS AND METHODS

[75] Inventors: George E. Gerpheide; Michael D. Layton, both of Salt Lake City, Utah

[73] Assignee: Cirque Corporation, Salt Lake City, Utah

[21] Appl. No.: 351,008

[22] Filed: Dec. 7, 1994

Related U.S. Application Data

[63] Continuation-in-part of Ser. No. 193,275, Feb. 8, 1994, Pat. No. 5,478,170, which is a continuation of Ser. No. 914,043, Jul. 13, 1992, Pat. No. 5,305,017.

[51] Int. Cl.$^6$ .................................................. G08C 21/00
[52] U.S. Cl. ............................................ 178/19; 345/174
[58] Field of Search .............................. 178/18, 19, 20; 345/168, 173, 174; 328/5; 342/16

[56] References Cited

U.S. PATENT DOCUMENTS

| | | | |
|---|---|---|---|
| 4,237,421 | 12/1980 | Waldron | 325/5 |
| 4,371,746 | 2/1983 | Pepper, Jr. | 178/18 |
| 4,476,463 | 10/1984 | Ng et al. | 178/187 |
| 4,845,682 | 7/1989 | Boozer et al. | 342/16 X |
| 5,053,757 | 10/1991 | Meadows | 178/18 X |
| 5,305,017 | 4/1994 | Gerpheide | 345/174 |

*Primary Examiner*—Stephen Chin
*Assistant Examiner*—Paul Loomis
*Attorney, Agent, or Firm*—Thorpe, North & Western

[57] ABSTRACT

Apparatus and method for a capacitance-based proximity sensor with interference rejection. A pair of electrode arrays establish a capacitance on a touch detection pad, the capacitance varying with movement of a conductive object near the pad. The capacitance variations are measured synchronously with a reference frequency signal to thus provide a measure of the position of the object. Electrical interference is rejected by producing a reference frequency signal which is not coherent with the interference.

14 Claims, 8 Drawing Sheets

CAPACITANCE-BASED PROXIMITY WITH INTERFERENCE REJECTION APPARATUS AND METHODS

The following patent is a continuation-in-part patent of U.S. patent application Ser. No. 08/193,275, filed Feb. 8, 1994, now U.S. Pat. No. 5,478,170, which is a continuation of Ser. No. 914,043, filed Jul. 13, 1992, now U.S. Pat. No. 5,305,017.

This invention relates generally to apparatus and methods for touch sensitive input devices, and more particularly, to apparatus and methods for capacitance-based touch detection wherein electrical interference is effectively rejected from the detection system.

BACKGROUND OF THE INVENTION

Numerous prior art devices and systems exist by which tactile sensing is used to provide data input to a data processor. Such devices are used in place of common pointing devices (such as a "mouse" or stylus) to provide data input by finger positioning on a pad or display device. These devices sense finger position by a capacitive touch pad wherein scanning signals are applied to the pad and variations in capacitance caused by a finger touching or approaching the pad are detected. By sensing the finger position at successive times, the motion of the finger can be detected. This sensing apparatus has application for controlling a computer screen cursor. More generally it can provide a variety of electrical equipment with information corresponding to finger movements, gestures, positions, writing, signatures and drawing motions.

In U.S. Pat. No. 4,698,461, Meadows et al., a touch surface is covered with a layer of invariant resistivity. Panel scanning signals are applied to excite selected touch surface edges so as to establish an alternating current voltage gradient across the panel surface. When the surface is touched, a touch current flows from each excited edge through the resistive surface and is then coupled to a user's finger (by capacitance or conduction), through a user's body, and finally coupled by the user's body capacitance to earth ground potential. Different scanning sequences and modes of voltage are applied to the edges, and in each case the currents are measured. It is possible to determine the location of touch by measuring these currents. In particular, the physical parameter which indicates touch location is the resistance from the edges to the point of touch on the surface. This resistance varies as the touch point is closer or farther from each edge. For this system, the term "capacitive touch pad" may be a misnomer because capacitance is involved as a means of coupling current from the surface touch point through the user's finger but is not the parameter indicative of finger position. A disadvantage of this invention is that accurate touch location measurement depends on uniform resistivity of the surface. Fabricating such a uniformly resistive surface layer can be difficult and expensive, and require special fabrication methods and equipment.

The panel of the Meadows '461 patent also includes circuitry for "nulling", or offsetting to zero, the touch currents which are present when the panel is not touched. This nulling can be accomplished while the panel operates, and allows touches which generate a relatively weak signal, such as from a gloved finger, to be more accurately determined. The Meadows '461 panel also includes circuitry for automatically shifting the frequency of panel scanning signals away from spectra of spurious signals, such as those developed by cathode-ray tube transformers, which may be present in the environment. The panel seeks to avoid interference from the spurious signals, which could happen if the frequency of scanning was nearly equal to that of the spurious signals. A microcontroller determines whether the scanning frequency should be shifted by monitoring the rate at which adjustments are required in nulling of the touch currents, as described above. The only means described for generating frequency control signals is based on this nulling adjustment.

U.S. Pat. No. 4,922,061, Meadows et al., is similar to the Meadows '461 patent in that the touch panel determines touch location based on variations in resistance, not capacitance. This is particularly evident from FIG. 2 where the resistances from edge to touch point are shown as Kx times Rx, where Kx is corresponds to the distance indicated by 76A. The apparatus uses a measurement signal of a frequency that varies in a substantially random manner, thus reducing susceptibility to interference from spurious electromagnetic spectra.

U.S. Pat. No. 4,700,022, Salvador, describes an array of detecting conductive strips, each laid between resistive emitting strips. The finger actually makes electrical contact from an emitting strip to detecting strip. Touch location is determined from resistance variation (as with Meadows '461 and '061 above) in the strip contacted by the finger. Averages are taken of a certain number of synchronous samples. A design formula is presented to choose a sampling frequency so that it is not a multiple of the most undesired predetermined interfering signal. No suggestion is made that sampling frequency is adjusted or adapts automatically.

In U.S. Pat. No. 5,305,017, Gerpheide, touch location is determined by true capacitance variation, instead of resistance variation, using a plurality of electrode strips forming virtual electrodes. This approach eliminates the necessity of a coating having uniform resistance across a display screen. However, such a capacitance-based detection device may suffer from electrical background interference from its surroundings, which is coupled onto the sensing electrodes and interferes with position detection. These spurious signals cause troublesome interference with the detection of finger positioning. The device operator may even act as an antenna for electrical interference which may cause a false charge injection or depletion from the detecting electrodes.

Accordingly, there is a need for a touch detection system which has the following characteristics:

(1) the touch location is determined without the need of resistance variation so as to avoid the high cost of requiring uniform resistance during fabrication;

(2) the touch location is measured in a manner independent of resistance of the electrodes or their connecting wiring, thus broadening the range of materials and processes which may be used for fabrication; and (3) electrical interference signals are rejected and eliminated from the detection system regardless of their frequency and without requiring possibly expensive nulling apparatus.

SUMMARY OF THE INVENTION

The present invention employs a touch location device having true capacitance variation by using insulated electrode arrays to form virtual electrodes. The capacitance variation is measured by means independent of the resistance of the electrodes, so as to eliminate that parameter as a fabrication consideration. The electrical interference is eliminated regardless of frequency to provide a clear detection signal.

An illustrative embodiment of the present invention includes an electrode array for developing capacitances which vary with movement of an object (such as finger, other body part, conductive stylus, etc.) near the array, a synchronous capacitance measurement element which measures variation in the capacitances, such measurements being synchronized with a reference frequency signal, and a reference frequency signal generator for generating a reference frequency signal which is not coherent with electrical interference which could otherwise interfere with capacitance measurements and thus position location.

Interference rejection is carried out by generating a reference frequency signal whose frequency is different from the interference frequency. Alternately, the reference signal is generated with random frequencies so as not to be coherent with the interference frequencies and thus the electrical interference is effectively rejected.

DETAILED DESCRIPTION OF PREFERRED EMBODIMENTS

Figure 1:
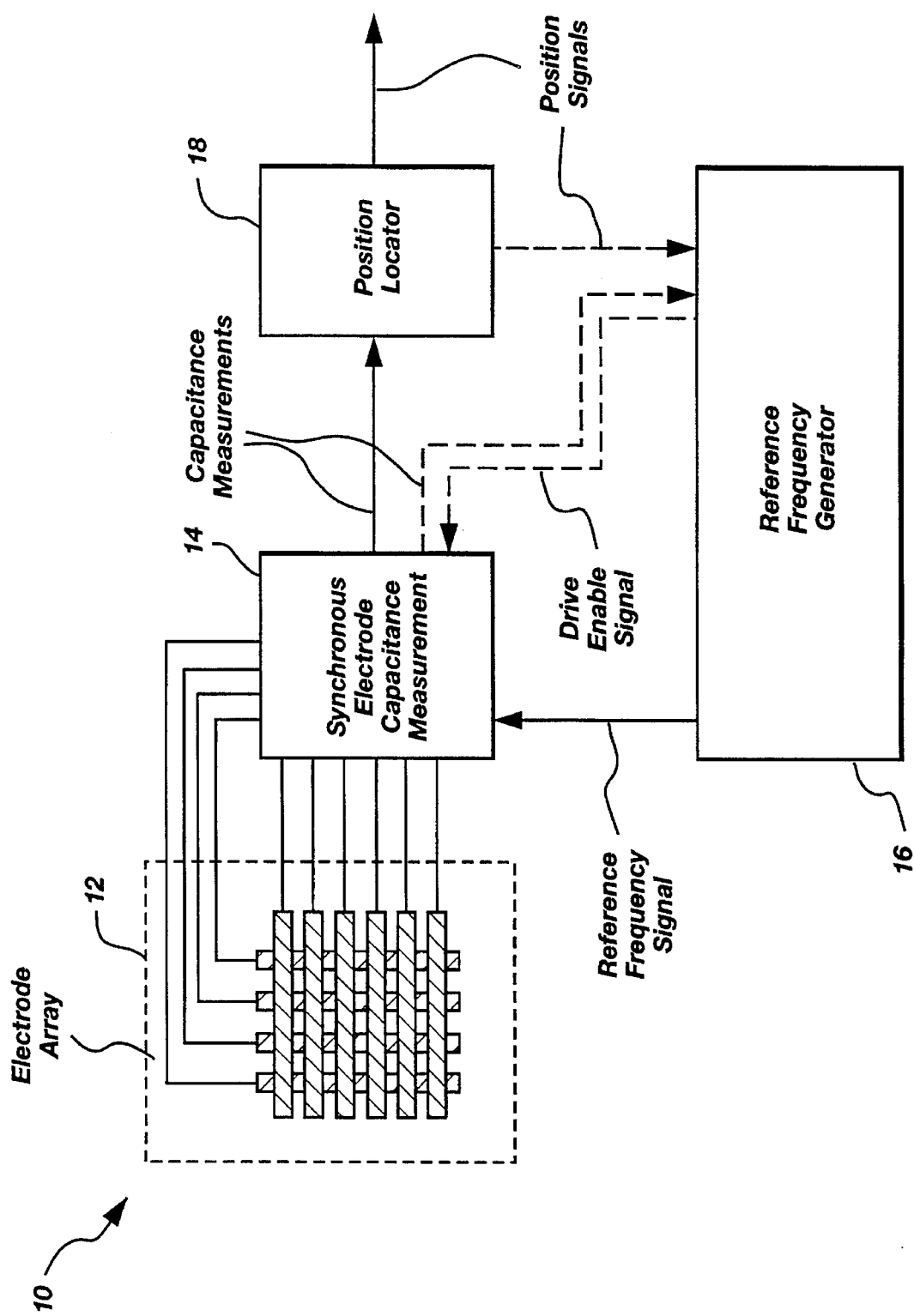
FIG. 1 is a block diagram of a capacitance variation position measuring device made in accordance with the principles of the present invention.

FIG. 1 shows the essential elements of a capacitance variation finger (or other conductive body or non-body part) position sensing system 10, made in accordance with the invention. An electrode array 12 includes a plurality of layers of conductive electrode strips. The electrodes and the wiring connecting them to the device may have substantial resistance, which permits a variety of materials and processes to be used for fabricating them. The electrodes are electrically insulated from one another. Mutual capacitance exists between each two of the electrodes, and stray capacitance exists between each of the electrodes and ground. A finger positioned in proximity to the array alters these mutual and stray capacitance values. The degree of alteration depends on the position of the finger with respect to electrodes. In general, the alteration is greater when the finger is closer to the electrode in question.

A synchronous electrode capacitance measurement unit 14 is connected to the electrode array 12 and determines selected mutual and/or stray capacitance values associated with the electrodes. To minimize interference, a number of measurements are performed by unit 14 with timing synchronized to a reference frequency signal provided by reference frequency generator 16. The desired capacitance value is determined by integrating, averaging, or in more general terms, by filtering the individual measurements made by unit 14. In this way, interference in the measurement is substantially rejected except for spurious signals having strong frequency spectra near the reference frequency.

The reference frequency generator 16 attempts to automatically select and generate a reference frequency which is not coherent with the most undesirable frequency of spurious signals. This approach substantially eliminates interference even though its frequency is likely to be initially unknown and may even change during operation.

A position locator 18 processes the capacitance measurement signal from the synchronous electrode capacitance measurement unit 14 and provides position signals for use by a host computer, for example, and to the reference frequency generator 16. The position locator unit 18 determines finger position signals based on the capacitance measurements. Several different systems are commonly known in the art for determining finger position based on measurements of capacitance associated with electrodes in an array. Position locators may provide one-dimensional sensing (such as for a volume slider control), two-dimensional sensing with contact determination (such as for computer cursor control), or full three-dimensional sensing (such as for games and three-dimensional computer graphics.) An example of a prior art position locator unit is shown in the Gerpheide '017 patent mentioned above, as units 40 and 50 of FIG. 1 of the patent.

Electrode Array

Figure 2A:
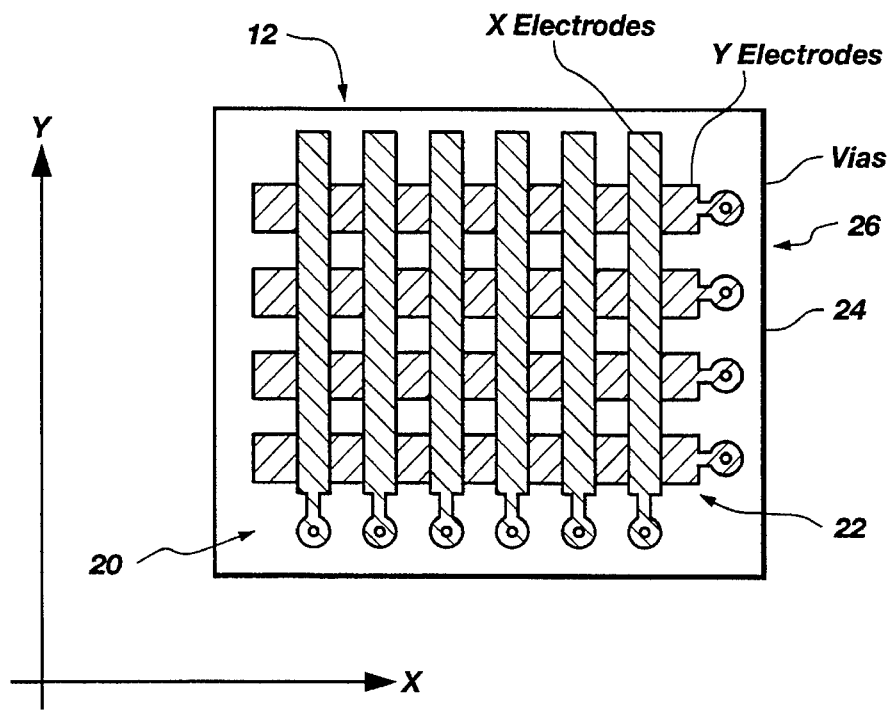
FIG. 2A is a plan view of one illustrative embodiment of the electrode array shown in FIG. 1.

FIG. 2A illustrates the electrodes in a preferred electrode array 12, together with a coordinate axes defining X and Y directions. One embodiment includes sixteen X electrodes and twelve Y electrodes, but for clarity of illustration, only six X electrodes 20 and four Y electrodes 22 are shown. It is apparent to one skilled in the art how to extend the number of electrodes. The array is preferably fabricated as a multilayer printed circuit board 24. The electrodes are etched electrically conductive strips, connected to vias 26 which in turn connect them to other layers in the array. Illustratively, the array 12 is approximately 65 millimeters in the X direction and 49 millimeters in the Y direction. The X electrodes are approximately 0.7 millimeters wide on 3.3 millimeter centers. The Y electrodes are approximately three millimeters wide on 3.3 millimeter centers.

Figure 2B:
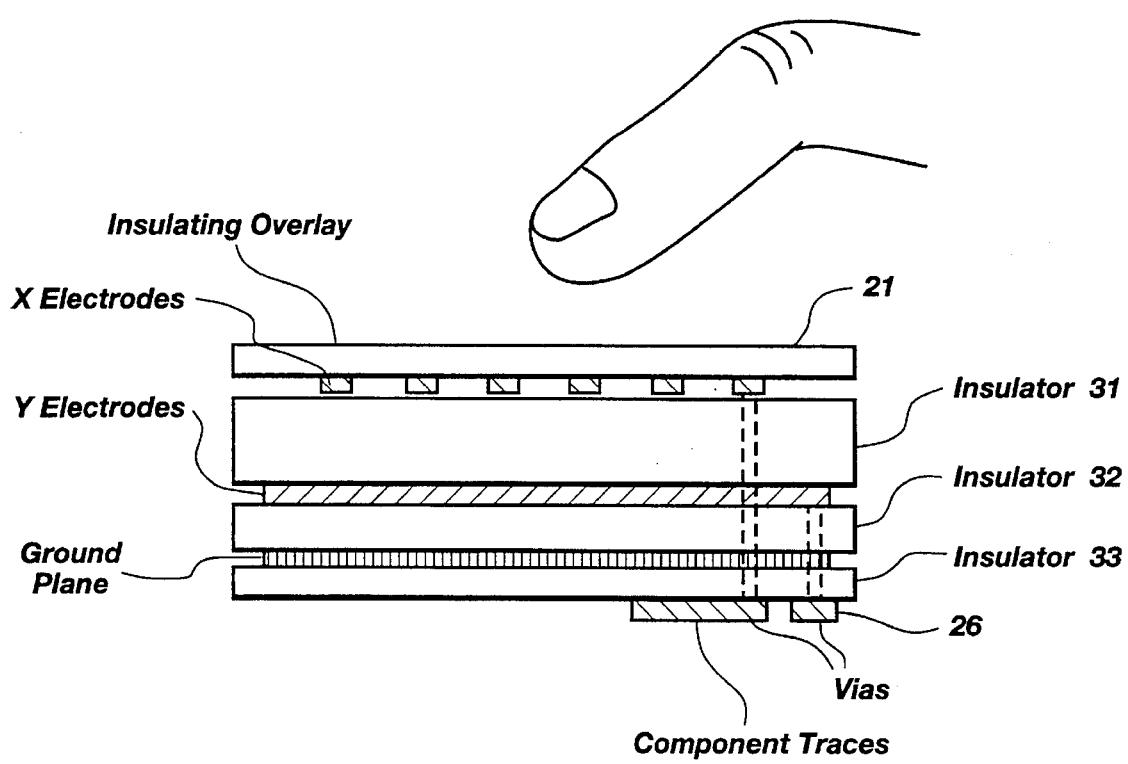
FIG. 2B is a side, cross-sectional view of one illustrative embodiment of the electrode array of FIG. 2A.

FIG. 2b illustrates the electrode array 12 from a side, cross-sectional view. An insulating overlay 21 is an approximately 0.2 millimeters thick clear polycarbonate sheet with a texture on the top side which is comfortable to touch. Wear resistance may be enhanced by adding a textured clear hard coating over the top surface. The overlay bottom surface may be silk-screened with ink to provide graphics designs and colors.

The X electrodes 20, Y electrodes 22, ground plane 25 and component traces 27 are etched copper traces within a multilayer printed circuit board. The ground plane 25 covers the entire array area and shields the electrodes from electrical interference which may be generated by the parts of the circuitry. The component traces 27 connect the vias 26 and hence the electrodes 20, 22, to other circuit components of FIG. 1. Insulator 31, insulator 32 and insulator 33 are fiberglass-epoxy layers within the printed circuit board 24. They have respective thicknesses of approximately 1.0 millimeter, 0.2 millimeters and 0.1 millimeters. Dimensions may be varied considerably as long as consistency is maintained. However, all X electrodes 20 must be the same size, as must all Y electrodes 22.

Figure 3A:
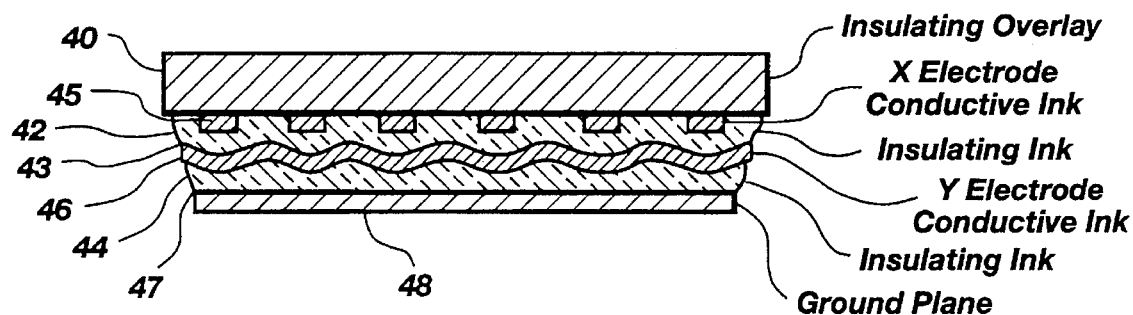
FIG. 3A is a side, cross-sectional view of another embodiment of the electrode array of FIG. 1.

One skilled in the art will realize that a variety of techniques and materials can be used to form the electrode array. For example, FIG. 3A illustrates an alternative embodiment in which the electrode array includes an insulating overlay 40 as described above. Alternate layers of conductive ink 42 and insulating ink 43 are applied to the reverse surface by a silk screen process. The X electrodes 45 are positioned between the insulating overlay 40 and X electrode conductive ink layer 42. Another insulating ink layer 43 is applied below layer 42. The Y electrodes 46 are positioned between insulating ink layer 43 and conductive ink layer 44. Another insulating ink layer 47 is applied below conductive ink layer 44, and ground plane 48 is affixed to Y electrode conductive ink layer 47. Each layer is approximately 0.01 millimeters thick.

The resulting array is thin and flexible, which allows it to be formed into curved surfaces. In use it would be laid over a strong, solid support. In other examples, the electrode array may utilize a flexible printed circuit board, such as a flex circuit, or stampings of sheet metal or metal foil.

Figure 3B:
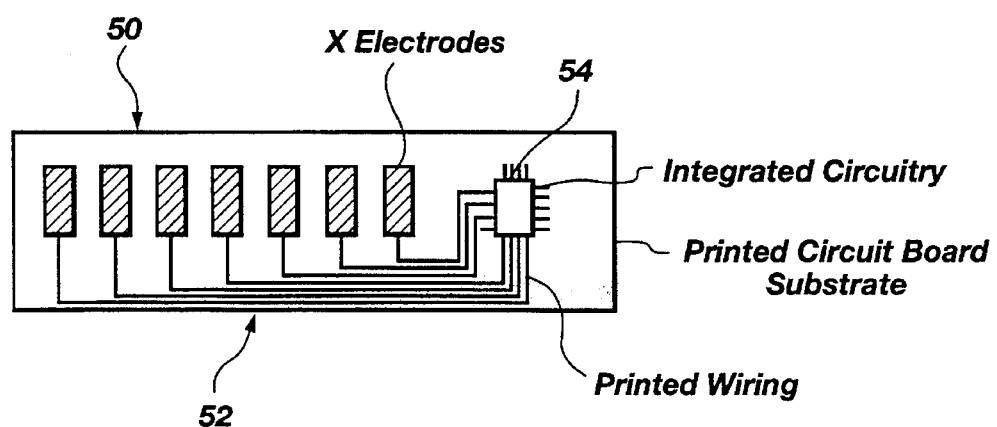
FIG. 3B is a plan view of the electrode array of FIG. 3A.

A variety of electrode geometries and arrangements are possible for finger position sensing. One example is shown in FIG. 3b. This is an array of parallel electrode strips 50 for one-dimensional position sensing which could be useful as a "slider volume control" or "toaster darkness control". Other examples include a grid of diamonds, or sectors of a disk.

It is desired that the electrode array of the present invention be easily fabricated by economical and widely available printed circuit board processes. It is also desired to allow use of various overlay materials selected for texture and low friction, upon which logo art work and coloration can be economically printed. A further preference is that the overlay may be custom printed separately from fabrication of the electrode-containing part of the array. This allows an economical standardized mass production of that part of the array, and later affixing of the custom printed overlay.

Synchronous Electrode Capacitance Measurement

Figure 4:
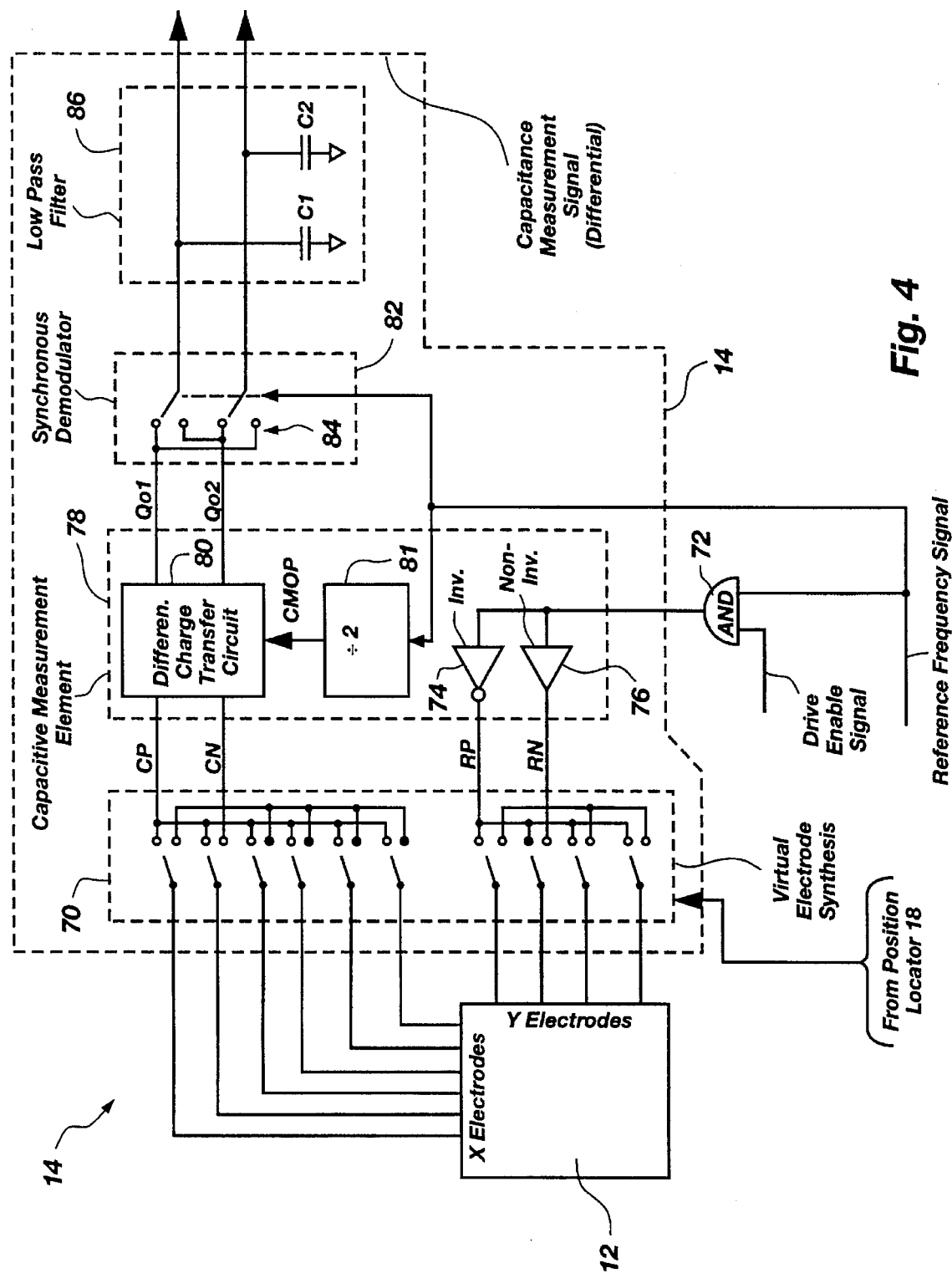
FIG. 4 is a schematic of one embodiment of the synchronous electrode capacitance measurement device of FIG. 1.

FIG. 4 shows one embodiment of the synchronous electrode capacitance measurement unit 14 in more detail. The key elements of the synchronous electrode capacitance measurement unit 14 are (a) an element for producing a voltage change in the electrode array synchronously with a reference signal, (b) an element producing a signal indicative of the displacement charge thereby coupled between electrodes of the electrode array, (c) an element for demodulating this signal synchronously with the reference signal, and (d) an element for low pass filtering the demodulated signal. Unit 14 is coupled to the electrode array, preferably through a multiplexor or switches. The capacitances to be measured in this embodiment are mutual capacitances between electrodes but could be stray capacitances of electrodes to ground or algebraic sums (that is sums and differences) of such mutual or stray capacitances.

FIG. 4 shows one specific embodiment of a synchronous electrode capacitance measurement unit 14 connected to the electrode array 12, in which algebraic sums of mutual capacitances between electrodes are measured. The components are grouped into four main functional blocks. A virtual electrode synthesis block 70 connects each of the X electrodes to one of the wires CP or CN, and each of the Y electrodes to one of the wires RP or RN. The electrodes are selectively connected to the wires by switches, preferably CMOS switches under control of the position locator apparatus 18 (FIG. 1) to select appropriate electrodes for capacitance measurement. (See Gerpheide '017 which describes such electrode selection by signal S of FIG. 1 of the patent.) All electrodes connected to the CP wire at any one time are considered to form a single "positive virtual X electrode". Similarly, the electrodes connected to CN, RP, and RN form a "negative virtual X electrode", a "positive virtual Y electrode", and a "negative virtual Y electrode", respectively.

The reference frequency signal is preferably a digital logic signal from the reference frequency generator 16 (FIG. 1). The reference frequency signal is supplied to unit 14 via an AND gate 72 also having a "drive enable" input, supplied by the reference frequency generator 16 (FIG. 1). The AND gate output feeds through inverter 74 and noninverting buffer 76 to wires RP and RN respectively which are part of a capacitive measurement element 78. In the preferred embodiment, the drive enable signal is always TRUE, to pass the reference frequency signal. In further preferred embodiments, it is asserted FALSE by the reference frequency generator when interference evaluation is to be performed as described later. When the drive enable signal is FALSE, the drive signal stays at a constant voltage level. When the drive signal is TRUE, it is a copy of the reference frequency signal.

The capacitance measurement element 78 contains a differential charge transfer circuit 80 as illustrated in FIG. 4 of Gerpheide, U.S. Pat. 5,349,303, incorporated herein by reference. Capacitors Cs1 and Cs2 of FIG. 4 of that patent correspond to the stray capacitances of the positive and negative virtual electrodes to ground. The CHOP signal of that FIG. 4 is conveniently supplied in the present invention as a square wave signal having half the frequency of the reference frequency signal, as generated by the divide-by-2 circuit 81 shown herein. As described in the Gerpheide '303 patent, the circuit maintains CP and CN (lines 68 and 72 therein) at a constant virtual ground voltage.

The capacitance measurement element 78 also contains a non-inverting drive buffer 76 which drives RN and negative virtual Y electrodes to change voltage levels copying the drive enable signal transitions. The inverting buffer 74 drives RP and the positive virtual Y electrodes to change voltage levels opposite the drive enable signal transitions. Since CP and CN are maintained at virtual ground, these voltage changes are the net voltage changes across the mutual capacitances which exist between virtual Y and virtual X electrodes. Charges proportional to these voltage changes multiplied by the appropriate capacitance values are thereby coupled onto nodes CP and CN (the "coupled charges"). The charge transfer circuit therefore supplies a proportional differential charges at outputs Qo1 and Qo2, which are proportional to the coupled charges and thus to the capacitances.

In short, this differential charge is a proportionality factor K times the "balance" L, which is a combination of these capacitances given by the equation:

$$L = M(xp,yn) + M(xn,yp) - M(xp,yp) - M(xn,yn)$$

where M(a,b) is the notation for the mutual capacitance between virtual electrode "a" and virtual electrode "b". Changes in balance are indicative of finger position relative to virtual electrode position as described in Gerpheide, U.S. Pat. No. 5,305,017. The proportionality factor K has a sign which is the same as the drive enable signal transition direction.

Referring again to FIG. 4, the synchronous electrode capacitance measurement element 78 is connected via lines carrying charges Qo1 and Qo2 to a synchronous demodulator 82 which may be a double-pole double-throw CMOS switch 84 controlled by the reference frequency signal. The synchronous demodulator 82, which among other things functions to rectify the charges Qo1 and Qo2, is connected to a low-pass filter 86 which may be a pair of capacitors C1, C2 configured as an integrator for differential charges. (An integrator illustratively is a low pass filter with 6 db per octave frequency roll off.) Charges Qo1 and Qo2 are integrated onto capacitors C1 and C2, respectively, when the reference frequency signal has just transitioned positive, and K is positive. The charges are integrated onto opposite capacitors when K is negative. In this way, a differential charge proportional to the balance L is accumulated on C1 and C2.

Figure 5:
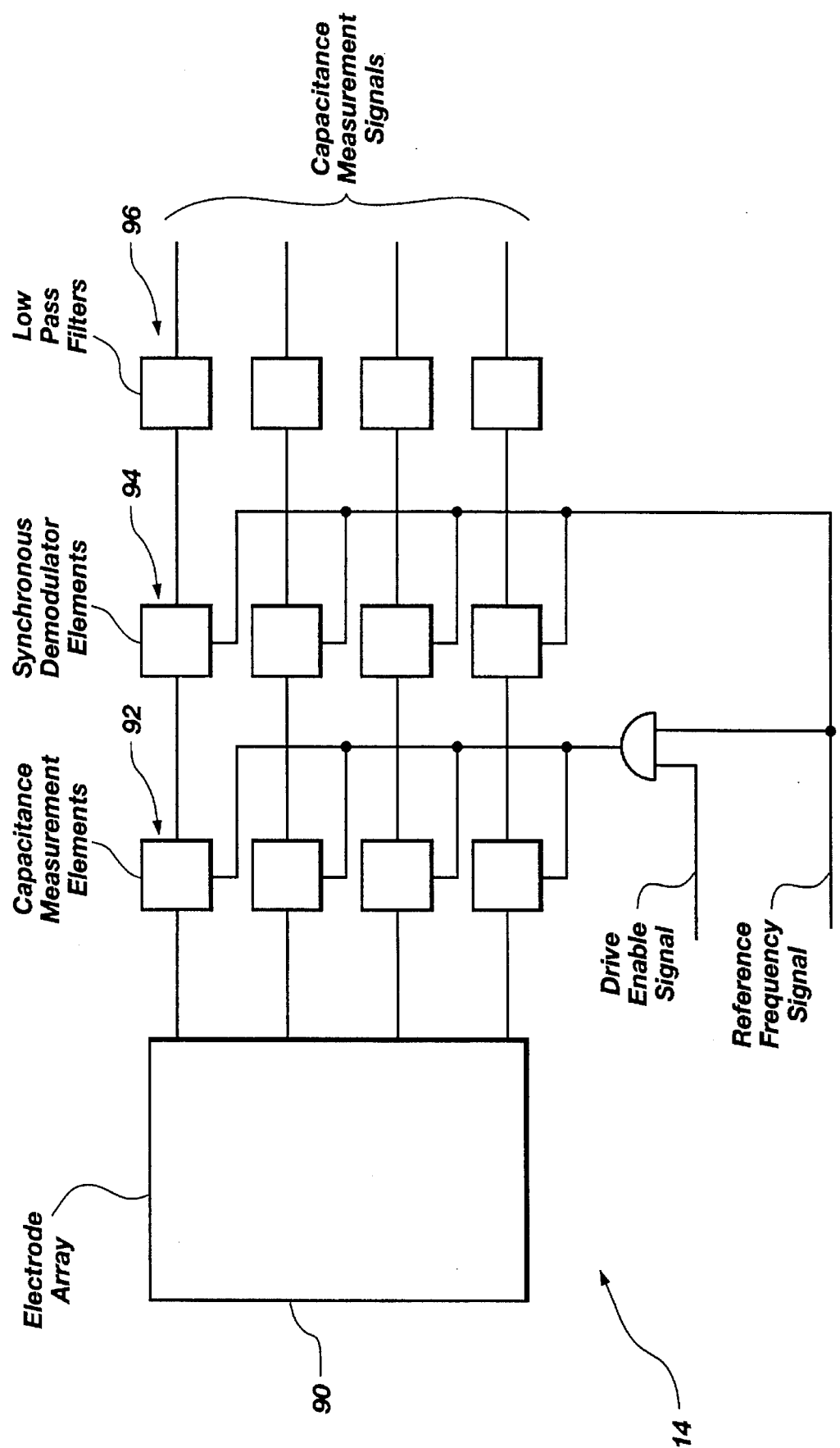
FIG. 5 is a schematic of another embodiment of the synchronous electrode capacitance measurement device of FIG. 1.

FIG. 5 shows another embodiment of the synchronous electrode capacitance measurement unit 14. In this embodiment, each electrode in an electrode array 90 is connected to a dedicated capacitance measurement element 92, each of which is connected to a synchronous demodulator 94 and then to a low pass filter 96. This configuration has the advantage of continuously providing capacitance measurements for each electrode, whereas the prior preferred embodiment measures a single configuration of electrodes at any one time. The disadvantage of the embodiment of FIG. 5 is the greater expense which may be associated with the duplicated elements. This is a common tradeoff between providing multiple elements to process measurements at the same time versus multiplexing a single element to process measurements sequentially. There is obviously a wide spectrum of variations applying this trade off.

Also, many of the elements can be implemented in digital form using analog-digital converters and digital signal processing. While the preferred embodiments currently use substantial analog processing, future digital processing costs may be expected to become relatively cheaper.

Figure 6A:
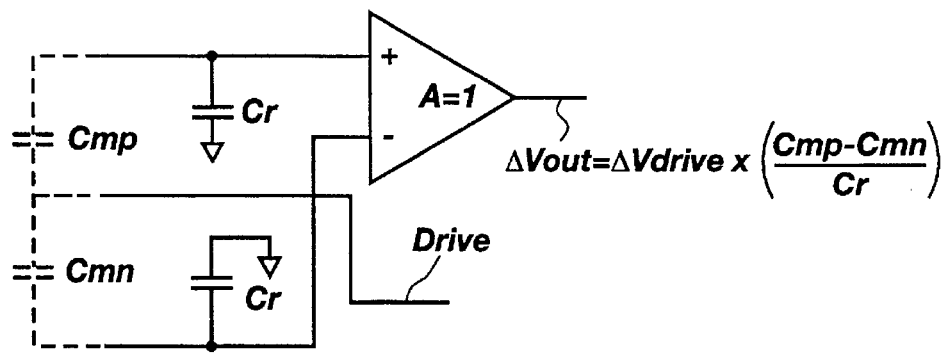
FIGS. 6A–6D are circuit diagrams of alternative embodiments of the capacitance measurement elements shown in FIGS. 4 and 5.

FIG. 6 provides a number of preferred alternatives for the capacitance measurement element 78 (FIG. 4) or 92 (FIG. 5). FIGS. 6A and 6B show circuits adapted for measuring mutual capacitances between electrodes (which may be physical or virtual electrodes), represented by Cmp, Cmn, and Cm. FIGS. 6C and 6D show circuits adapted for measuring electrode capacitance to ground represented by Cg. Each of these provides an output voltage change indicative of the capacitance being measured. These voltage changes are given by the following formulas:

For FIG. 6A:

$$\Delta Vout = \Delta Vdrive \times (Cmp - Cmn)/Cr$$

Figure 6B:
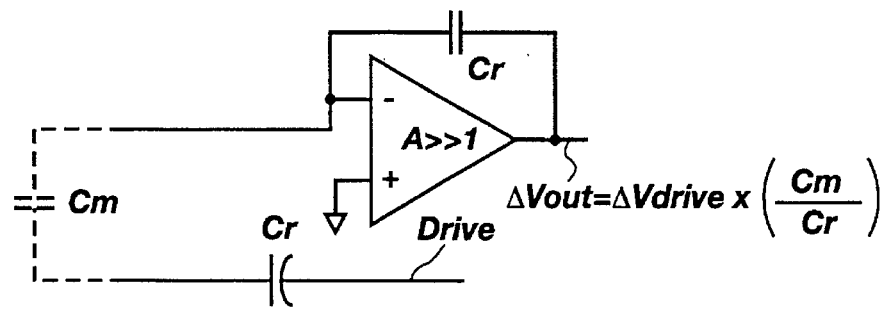

For FIG. 6B:

$$\Delta Vout = \Delta Vdrive \times Cm/Cr$$

Figure 6C:
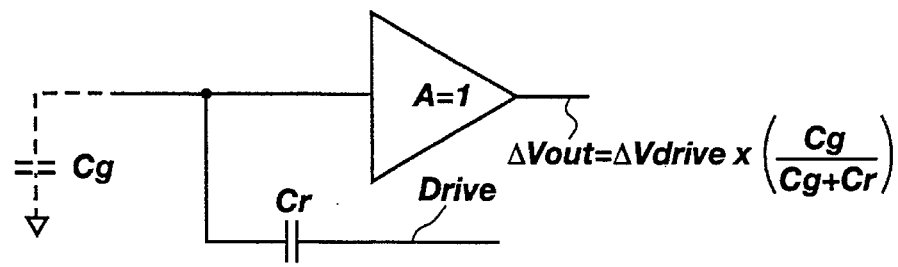

For FIG. 6C:

$$\Delta Vout = \Delta Vdrive \times Cg/(Cg+Cr)$$

Figure 6D:
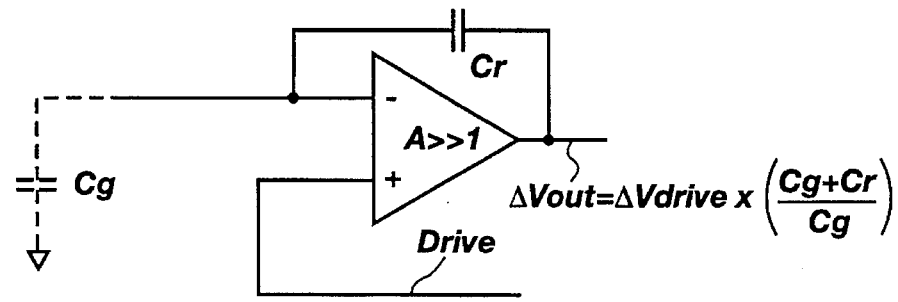

For FIG. 6D:

$$\Delta Vout = \Delta Vdrive \times (Cg+Cr)/Cg$$

The formulas depend on a known reference capacitance represented by Cr and a known drive voltage change represented by $\Delta Vdrive$. Further capacitance measurement elements may be based on charge balance techniques as described in Meyer, U.S. Pat. No. 3,857,092. Synchronous demodulators may be implemented using an analog or digital multiplier, or a "double-balanced mixer" integrated circuit (such as part number LM1496) from National Semiconductor Company. There are different implementations known in the art for low pass filter elements, such as switched capacitor integrators and filters, high-order analog filters, and digital filters.

Reference Frequency Generator

Figure 7:
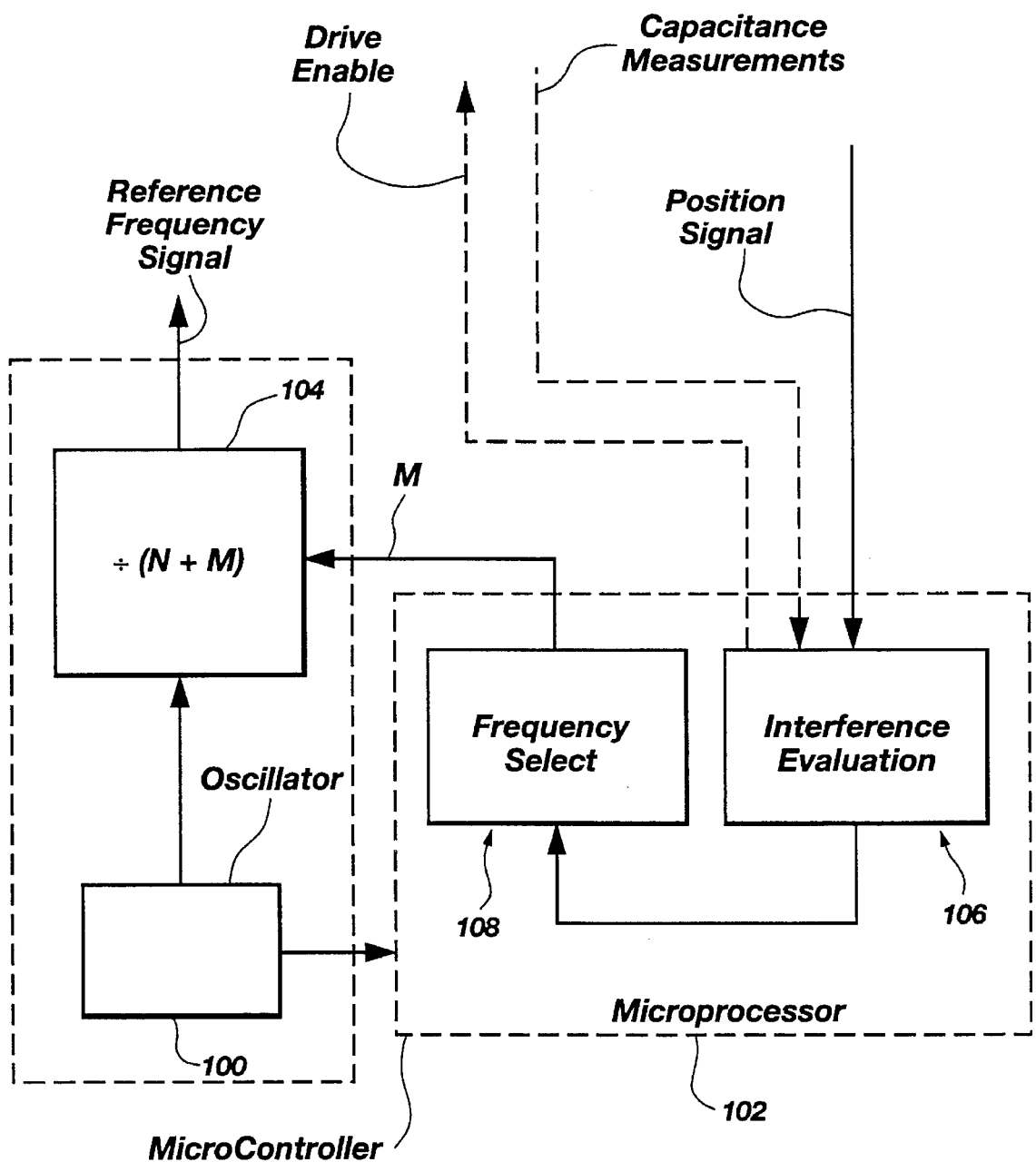
FIG. 7 is a block diagram of one embodiment of the reference frequency generator shown in FIG. 1.

FIG. 7 illustrates a preferred embodiment of reference frequency generator 16 (FIG. 1). The generator observes position signals to evaluate the extent of interference at some reference frequency. In the event that substantial interference is detected, the generator 16 selects a different frequency for further measurements. The generator 16 seeks to always select a reference frequency away from frequencies which have been found to result in measurement interference, as described below.

The generator 16 includes an oscillator 100 which is, for example, set at four MHz, driving a microcontroller 102 and a divide-by-(M+N) circuit 104. Value N is a fixed constant, approximately 50. Value M is specified by the microcontroller 102 to be, for example, one of four values in the range 61 KHz to 80 KHz as specified by the microcontroller 102.

The microcontroller 102 performs the functions of interference evaluation 106 and frequency selection 108. It may perform other functions associated with the system such as position location. The preferred interference evaluation function 106 produces a measure of the interference in the position signals generated by the position location unit 18 (FIG. 1). This is based on the principle that interference produces a spurious, relatively large magnitude high-frequency component of a position signal, and operates according to the following code description. It assumes position data points X, Y, and Z occur approximately every ten milliseconds. In brief, it calculates an interference measure, IM, as the sum of the absolute values of the second differences of X and Y together with the absolute values of the first differences of Z over 32 data points. Differencing a stream of data has the effect of applying a high-pass filter to it.

In detail, for each data point the interference evaluation function 106 executes the following steps, where ABS() means the absolute value function:

```
XD=X-XLAST      ;computes first differences
YD=Y-YLAST
ZD=Z-ZLAST
XDD=XD-XDLAST   ;computes second differences
YDD=YD-YLAST
IM = IM + ABS(XDD) + ABS(YDD) + ABS(Z)   ;sum
IF EVERY 32ND SAMPLE
    {EXECUTE FREQUENCY SELECT FUNCTION 108
    (See description below)
    IM = O}
```

```
XLAST=X         ;move current values to last
YLAST=Y
ZLAST=Z
XDLAST=XD
YDLAST=YD
```

In another embodiment, the interference evaluation function 106 is not based on position signals. Instead the function asserts the drive enable signal described above to a FALSE state and reads a resulting synchronous capacitance measurement. This measures charge coupled to the electrodes when no voltage is being driven across the electrodes by the apparatus. Such charge must be the result of interference, and so this interference (from spurious signals) is directly measured. This is another way to generate the interference measure, IM.

The preferred frequency select function 108 generates a table of historical interference measurements for each frequency which may be selected. On system initialization, each entry is set to zero. Thereafter, the frequency select function is activated approximately every 32 data points by the interference evaluation function 106. The current interference measure, IM, is entered as the entry for the currently selected frequency in the table. Then all table entries are scanned. The frequency having the lowest interference measure entry is selected as the new current frequency, and the corresponding M value is sent to the divide-by-(M+N) element 104. Approximately every 80 seconds, every entry in the table is decremented by an amount corresponding to approximately 0.05 mm of position change. In this way, if a frequency is flagged as "bad" by having strong interference one time, it will not be flagged as "bad" permanently.

The functions described above for the different embodiments could be carried out by a microprocessor such as part no. MC 68HC705P6 manufactured by Motorola, Inc. serving as the microcontroller 102.

Figure 8:
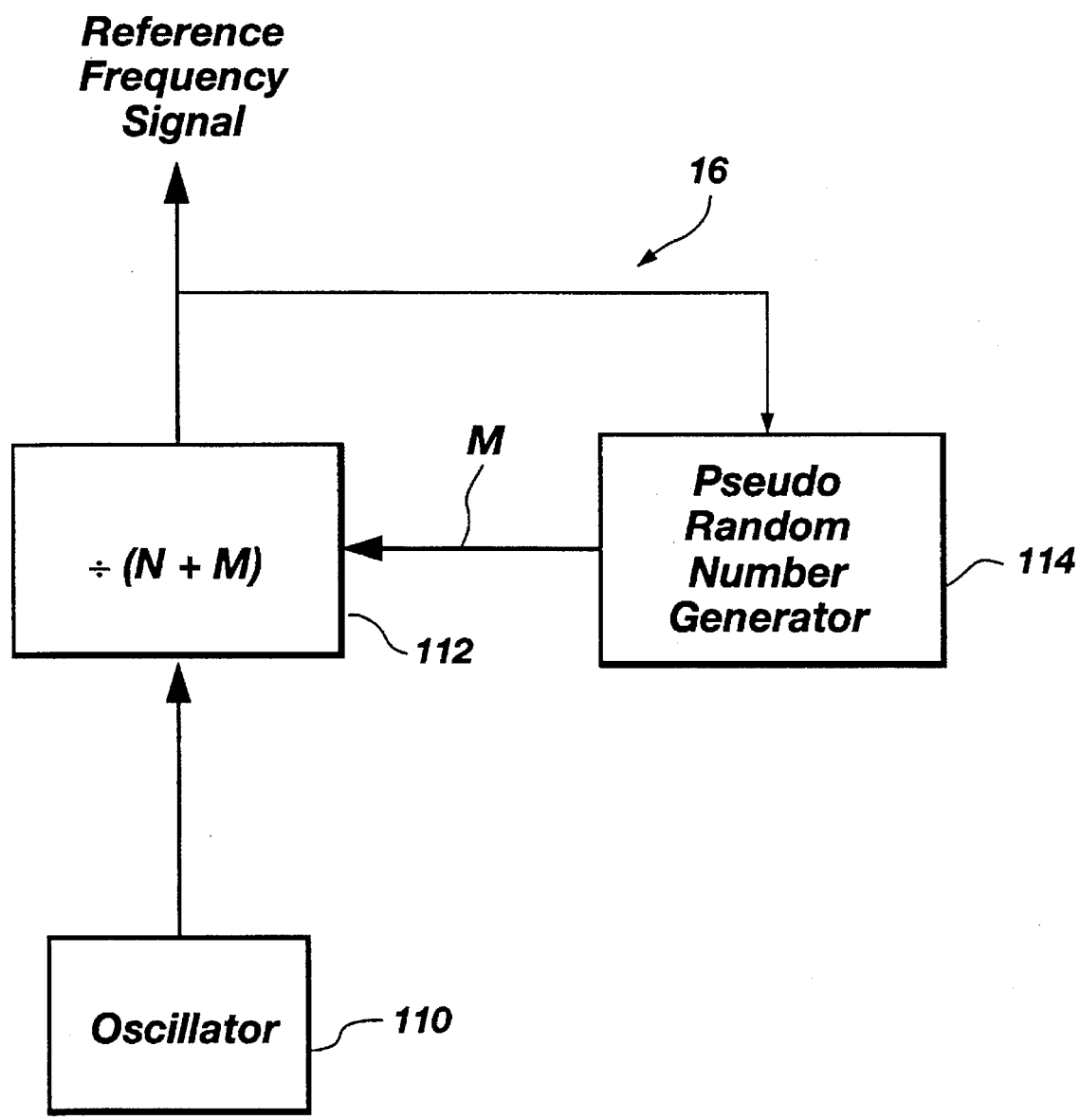
FIG. 8 is a block diagram showing an alternative embodiment of the reference frequency generator shown in FIG. 1.

FIG. 8 shows an alternate preferred embodiment of the reference frequency generator 16 (FIG. 1). It generates a reference frequency signal that varies randomly. Each cycle of the signal has a different and substantially random period. It is extremely unlikely that a spurious signal would coherently follow the same sequence of random variation. Hence the spurious signal is substantially rejected by capacitance measurements synchronous to the reference frequency. The degree of rejection is not as great as in the former embodiment, but the generator is simpler because interference evaluation and frequency selection functions are not needed.

The generator of FIG. 8 includes an oscillator 110 and a divide-by-(N+M) circuit 112. The value M supplied to the divider comes from a pseudo-random number generator (PRNG) 114 which generates numbers in the range 0 to 15. Each cycle of the reference frequency clocks the PRNG 114 to produce a new number. PRNGs are well known in the art.

For either embodiment in FIGS. 7 or 8, the range of values for M in relation to the value of N can be increased or decreased to give a greater or lesser range of possible frequencies. The value of N or the oscillator frequency can be adjusted to change the maximum possible frequency. A phase-locked frequency synthesizer such as the Motorola MC145151-2, or a voltage controlled oscillator driven by a D/A converter, could also preferably be employed instead of the divide-by-(M+N) circuit.

It should be understood that other variations of the preferred embodiments described above fall within the scope of this invention. Such variations include different electrode array geometry, such as a grid of strips, a grid of diamonds, parallel strips and various other shapes. Also included are different variations of electrode array fabrication, such as printed circuit board (PCB), flex PCB, silk screen, sheet or foil metal stampings. Variations of the kinds of capacitance utilized are included, such as full balance (see Gerpheide '017), stray, mutual, half balance.

The above description has provided certain preferred embodiments in accordance with this invention. It is apparent by those skilled in the art that various modifications can be made within the spirit and scope of the invention, which are included within the scope of the following claims.

What is claimed is:

1. A capacitance-based proximity sensor for locating the position of an object while rejecting a frequency of electrical interference, comprising:

(a) an electrode array for forming capacitances which vary with movements of the object, (b) measurement means coupled to the electrode array for measuring the capacitances synchronously with a reference signal, and (c) generator means for supplying a reference signal to the measurement means, said reference signal having a frequency which is not coherent with the frequency of electrical interference, wherein the generator means comprises means for evaluating the electrical interference and for producing the reference signal, and wherein the evaluating means includes means for storing a table of frequencies of selected reference signals and measures of electrical interference IM for each of these frequencies, and for producing a reference signal whose frequency has the lowest IM associated therewith.

2. A capacitance-based proximity sensor for locating the position of an object while rejecting electrical interference, comprising:

(a) an electrode array for forming capacitances which vary with movements of the object, (b) measurement means coupled to the electrode array for measuring the capacitances synchronously with a reference signal, (c) object locator means responsive to the measurement means for producing a position signal, having a high frequency component, indicating the position of the object relative to the electrode array, (d) generator means for supplying a reference signal to the measurement means, said reference signal having a frequency which is not coherent with the frequency of the electrical interference, and wherein said generator means comprises
     evaluation means responsive to the object locator means for determining the magnitude of the high frequency component of the position signal, and
     means responsive to the evaluation means for changing the frequency of the reference signal when the magnitude of the high frequency component of the position signal exceeds a predetermined value.

3. A capacitance-based proximity sensor for locating the position of an object while rejecting electrical interference, comprising:

(a) an electrode array for forming capacitances which vary with movements of the object, (b) measurement means coupled to the electrode array for measuring the capacitances synchronously with a reference signal, wherein said measurement means comprises driver means for developing, synchronously with the reference signal, voltage changes on the electrode array, charge measuring means for measuring, synchronously with the reference signal, charges coupled to the electrode array and thus capacitance, means for selectively inhibiting the driver means from developing voltage changes, the coupled charge measurements made during inhibition of the driver means representing the interference measure IM, and (c) generator means for supplying a reference signal to the measurement means, said reference signal having a frequency which is not coherent with the frequency of the electrical interference, wherein said generator means includes means for changing the frequency of the reference signal when the interference measure IM exceeds a predetermined level.

4. The proximity sensor as in claim 3 wherein the generator means further includes means for storing a table of frequencies of reference signals and associated interference measures IM made for reference signals with each of such frequencies, and for producing a reference signal whose frequency has the lowest interference measure IM associated therewith.

5. A capacitance-based proximity sensor for locating the position of an object while rejecting electrical interference, comprising:

(a) an electrode array for forming capacitances which vary with movements of the object, wherein the electrode array comprises a plurality of first electrode strips spaced apart from each other in a first array, and a plurality of second electrode strips spaced apart from each other and in close proximity with the first electrode strips;

(b) measurement means coupled to the electrode array for measuring the capacitances synchronously with a reference signal, and (c) generator means for supplying a reference signal to the measurement means, said reference signal having a frequency which is not coherent with the frequency of the electrical interference.

6. The proximity sensor of claim 5 wherein the measurement means includes driver means for developing, synchronously with the reference signal, voltage changes on the electrode array, a charge transfer means coupled to the electrode array for producing synchronously with the frequency of the reference signal, measurement signals representing charges coupled onto the electrode array as a result of the voltage changes, synchronous demodulator means coupled to the charge transfer means for rectifying the measurement signals synchronously with the reference signal, and low pass filter means coupled to the synchronous demodulator means for producing signals representing the average DC values of the rectified signals, and thus representing the capacitances of the electrode array.

7. The proximity sensor of claim 6 wherein the measurement means includes a plurality of capacitance measurement elements, each being connected to a respective electrode strip.

8. The proximity sensor of claim 7 further comprising a plurality of synchronous demodulation elements, each connected to a respective capacitance measurement element.

9. The proximity sensor of claim 1 further including a position locator means connected to the output of the measurement means for providing a position signal representative of the location of the object relative to the electrode array.

10. The detection system of claim 1 wherein the electrode array comprises first and second electrode sets spaced from each other to develop a capacitance for the touch pad.

11. The detection system of claim 10 wherein the first and second set of electrodes are generally orthogonal to each other to form virtual electrodes to provide capacitance.

12. The detection system of claim 1 wherein the measuring means comprises a capacitive measurement element coupled to the electrode array, a synchronous demodulator coupled to the capacitive measurement element, and a low-pass filter coupled to the demodulator.

13. A method of sensing the position of an object on an electrode array comprising the steps of:

(a) generating capacitances on the array which vary with movement of the object, (b) measuring the capacitances on the array synchronously with the frequency of a reference signal, and (c) generating a reference signal having a frequency which is not coherent with the frequencies of the electrical interference affecting the capacitances by evaluating the electrical interference, storing a table of frequencies of selected reference signals and measures of electrical interference IM for each of these frequencies, and for producing a reference signal whose frequency has the lowest IM associated therewith.

14. The method of claim 13 and further including producing a signal indicating the position of the object relative to the electrode array.

* * * * *